United States Patent
Siegman

(10) Patent No.: US 8,427,301 B2
(45) Date of Patent: Apr. 23, 2013

(54) SYSTEM AND METHOD FOR IDENTIFYING ELECTRICAL EQUIPMENT USING WIRELESS RECEIVERS

(75) Inventor: Craig S. Siegman, Pembroke Pines, FL (US)

(73) Assignee: Avocent Corporation, Huntsville, AL (US)

( * ) Notice: Subject to any disclaimer, the term of this patent is extended or adjusted under 35 U.S.C. 154(b) by 461 days.

(21) Appl. No.: 12/822,723

(22) Filed: Jun. 24, 2010

(65) Prior Publication Data
US 2011/0316690 A1 Dec. 29, 2011

(51) Int. Cl.
*G08B 1/08* (2006.01)

(52) U.S. Cl.
USPC ........................................................ 340/538

(58) Field of Classification Search .................. 340/538, 340/539.1, 540, 555, 572.1, 568.1, 815.45, 340/10.1, 13.24; 235/435, 454
See application file for complete search history.

(56) References Cited

U.S. PATENT DOCUMENTS

| | | | |
|---|---|---|---|
| 4,636,634 A | 1/1987 | Harper et al. | |
| 4,651,133 A | 3/1987 | Ganesan et al. | |
| 4,814,742 A | 3/1989 | Morita et al. | |
| 5,063,380 A | 11/1991 | Wakura | |
| 5,689,242 A | 11/1997 | Sims et al. | |
| 5,731,763 A | 3/1998 | Herweck et al. | |
| 5,771,003 A | 6/1998 | Seymour | |
| 6,127,928 A * | 10/2000 | Issacman et al. | 340/572.1 |
| 6,796,506 B1 * | 9/2004 | Pradhan et al. | 235/462.13 |
| 7,350,715 B2 * | 4/2008 | Pradhan et al. | 235/492 |
| 7,436,303 B2 | 10/2008 | Tourrilhes et al. | |
| 7,530,113 B2 | 5/2009 | Braun | |
| 7,865,582 B2 | 1/2011 | Santos et al. | |
| 8,223,015 B2 * | 7/2012 | Yuuki | 340/540 |
| 2004/0095241 A1 | 5/2004 | Maloney | |
| 2004/0160322 A1 | 8/2004 | Stilp | |
| 2004/0165358 A1 | 8/2004 | Regimbal | |
| 2004/0177143 A1 | 9/2004 | Maciel et al. | |
| 2005/0237194 A1 | 10/2005 | VoBa | |
| 2006/0082222 A1 | 4/2006 | Pincu et al. | |
| 2006/0097863 A1 | 5/2006 | Horowitz et al. | |

(Continued)

FOREIGN PATENT DOCUMENTS

| | | |
|---|---|---|
| DE | 102007034437 | 5/2008 |
| JP | S64-077374 | 9/1987 |

(Continued)

OTHER PUBLICATIONS

International Search Report and Written Opinion mailed May 23, 2011 in PCT Appln. No. PCT/US2011/000565.

(Continued)

*Primary Examiner* — Phung Nguyen

(74) *Attorney, Agent, or Firm* — Davidson Berquist Jackson & Gowdey, LLP

(57) ABSTRACT

By utilizing a transmitter that plugs into a power socket of a piece of electrical equipment, that equipment may be locatable using a specialized power source that interacts with the transmitter. The specialized power source sends a command signal across a power cable and causes the transmitter to send a response signal. The response signal is received by one or more receivers, and the position of the equipment within its corresponding cabinet/rack can be determined. The response signal can be sent using a number of different techniques, such as ultrasonic or infrared.

20 Claims, 6 Drawing Sheets

U.S. PATENT DOCUMENTS

| | | | |
|---|---|---|---|
| 2006/0149407 | A1 | 7/2006 | Markham et al. |
| 2006/0176643 | A1 | 8/2006 | Pecore |
| 2007/0005382 | A1* | 1/2007 | Sayers .............................. 705/1 |
| 2007/0141869 | A1* | 6/2007 | McNeely et al. ............ 439/76.1 |
| 2007/0222597 | A1* | 9/2007 | Tourrilhes et al. ......... 340/572.1 |
| 2007/0250410 | A1 | 10/2007 | Brignone |
| 2007/0276548 | A1 | 11/2007 | Uzunovic et al. |
| 2008/0063563 | A1 | 3/2008 | Watari |
| 2008/0106425 | A1 | 5/2008 | Deaver et al. |
| 2008/0218148 | A1 | 9/2008 | Robertson et al. |
| 2008/0252459 | A1 | 10/2008 | Butler et al. |
| 2009/0013210 | A1 | 1/2009 | McIntosh et al. |
| 2009/0079416 | A1 | 3/2009 | Vinden et al. |
| 2009/0108995 | A1 | 4/2009 | Tucker et al. |
| 2009/0174569 | A1 | 7/2009 | Smith et al. |
| 2009/0327782 | A1 | 12/2009 | Ballou et al. |
| 2010/0090542 | A1 | 4/2010 | Johnson et al. |
| 2010/0145542 | A1 | 6/2010 | Chapel et al. |

FOREIGN PATENT DOCUMENTS

| | | |
|---|---|---|
| JP | 01-162480 | 6/1989 |
| JP | H11-203457 | 1/1998 |
| JP | 11-308465 | 4/1998 |

OTHER PUBLICATIONS

International Search Report and Written Opinion mailed Jun. 13, 2011 in PCT Appln. No. PCT/US2011/000569.

CN Appln. No. 201120119581.2—Nov. 10, 2011 SIPO Notice of Amendment.

Preliminary Report on Patentability mailed Aug. 16, 2012 in PCT/US2011/000158.

U.S. Appl. No. 12/546,498—Jul. 30, 2012 PTO Office Action.

International Search Report and Written Opinion from PCT Appln. No. PCT/US2010/02301 mailed Oct. 22, 2010.

International Search Report and Written Opinion mailed Sep. 1, 2010 in PCT Appln. No. PCT/US2010/001940.

JP Appln. No. 2005-510478—Jul. 6, 2010 Decision of Rejection (English translation).

U.S. Appl. No. 11/965,589—Jan. 18, 2011 PTO Office Action.

U.S. Appl. No. 12/546,498—Feb. 1, 2011 PTO Office Action.

U.S. Appl. No. 12/546,498—Sep. 28, 2011 PTO Office Action.

U.S. Appl. No. 12/546,514—Oct. 7, 2011 PTO Office Action.

U.S. Appl. No. 11/965,589—Dec. 14, 2011 PTO Office Action.

U.S. Appl. No. 12/546,498—Dec. 21, 2011 PTO Office Action.

Anonymous, "RFID" definition, Wikipedia.com, Published: Jun. 14, 2012, pp. 1-26.

U.S. Appl. No. 12/546,514—Jul. 3, 2012 PTO Office Action.

U.S. Appl. No. 12/697,511—Oct. 11, 2011 PTO Office Action.

U.S. Appl. No. 12/697,511—Dec. 10, 2012 PTO Office Action.

* cited by examiner

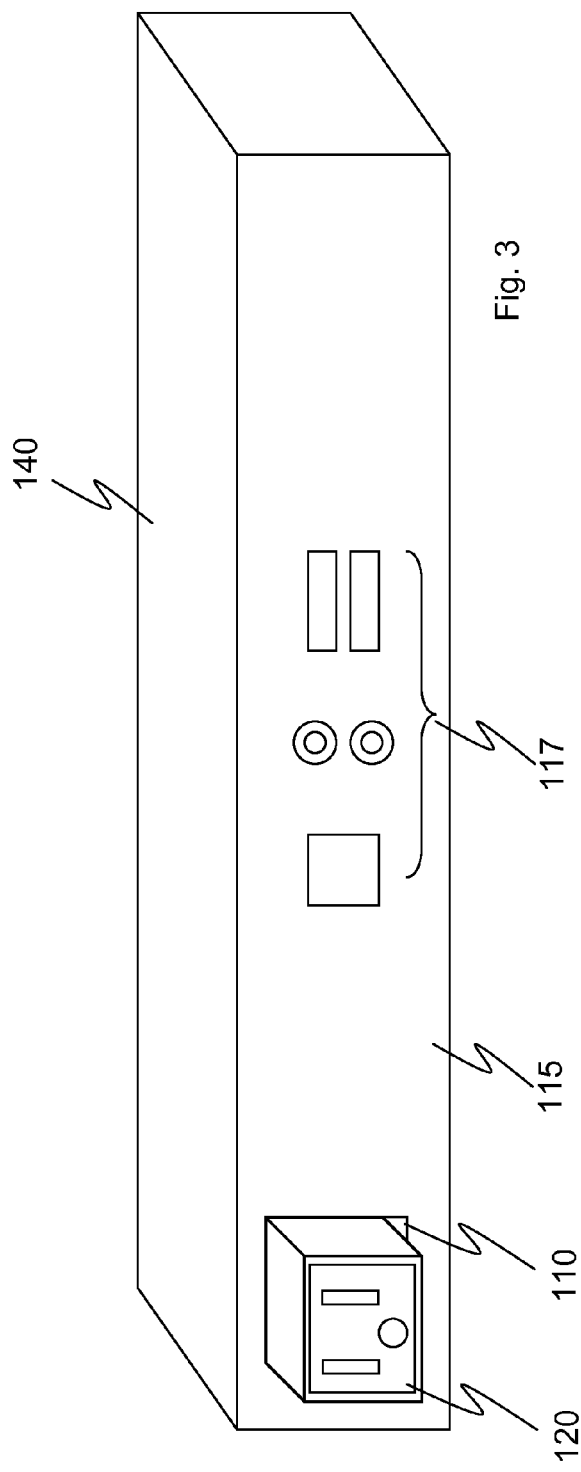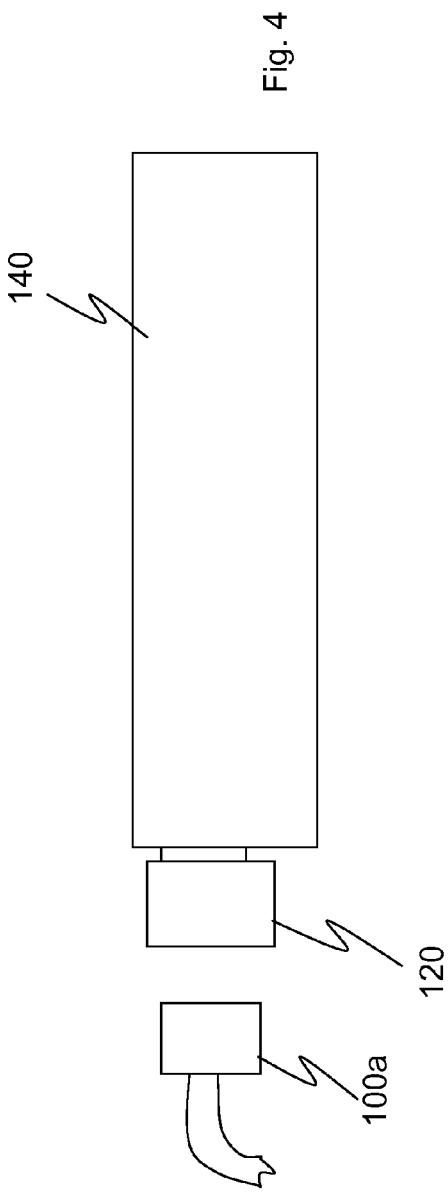

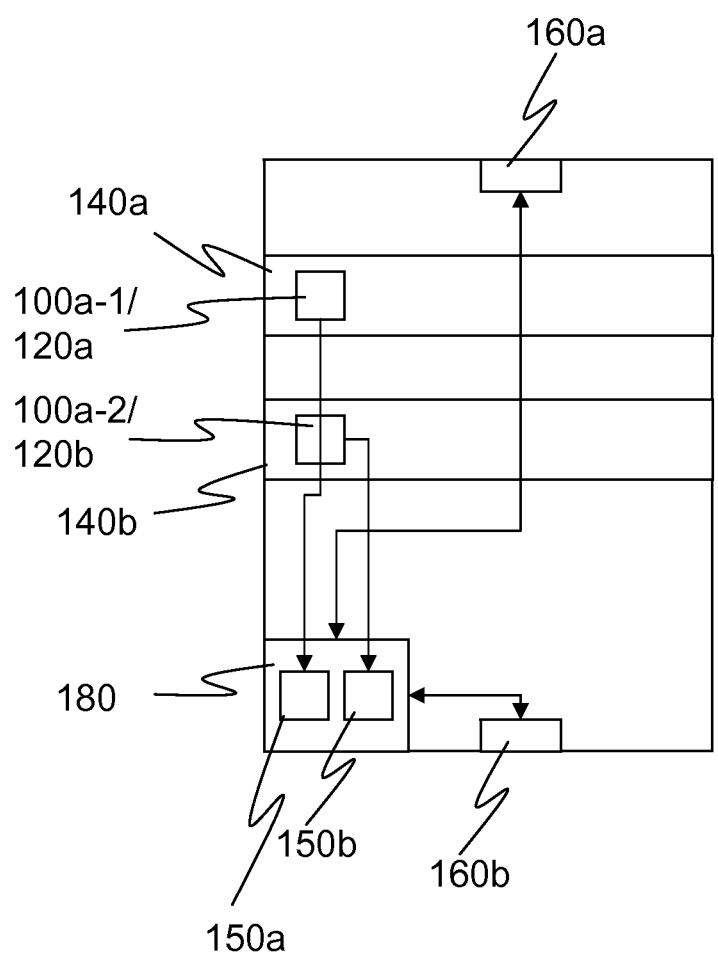

SYSTEM AND METHOD FOR IDENTIFYING ELECTRICAL EQUIPMENT USING WIRELESS RECEIVERS

FIELD OF INVENTION

The present invention is directed to a system and method for identifying electrical equipment connected to a specialized power supply, and in one embodiment to a system and method of identifying electrical equipment connected to a remotely-controllable power distribution unit (PDU) communicating with at least one wireless transmitter and at least one wireless receiver.

DISCUSSION OF THE BACKGROUND

Due to changes in the location of electrical equipment in large data centers, a significant amount of time and effort may be required to track down where any one particular piece of electrical equipment is in the data center. For example, if a server has been moved from one rack to another without having had a location log updated, a system administrator may have trouble locating the server when the server automatically reports an error. This results in the possibility of wasted efforts to find the server and may result in longer down times for the server after a server crash or hardware failure.

BRIEF DESCRIPTION OF THE DRAWINGS

The following description, given with respect to the attached drawings, may be better understood with reference to the non-limiting examples of the drawings, wherein:

FIG. 3 is a block diagram of the electrical equipment of FIG. 2 along with a transmitter for wirelessly transmitting a response signal after receipt of a trigger signal across an electrical cord such as in FIG. 1; and FIG. 4 is a side view of an electrical plug of FIG. 1 and the electrical equipment of FIG. 3;

FIG. 5 is a back view of a rack of electrical equipment including a Power Distribution Unit and wireless receivers for receiving a response signal received from the transmitter of FIG. 3 after receipt of a trigger signal across an electrical cord such as in FIG. 1;

DISCUSSION OF THE PREFERRED EMBODIMENTS

Figure 1:
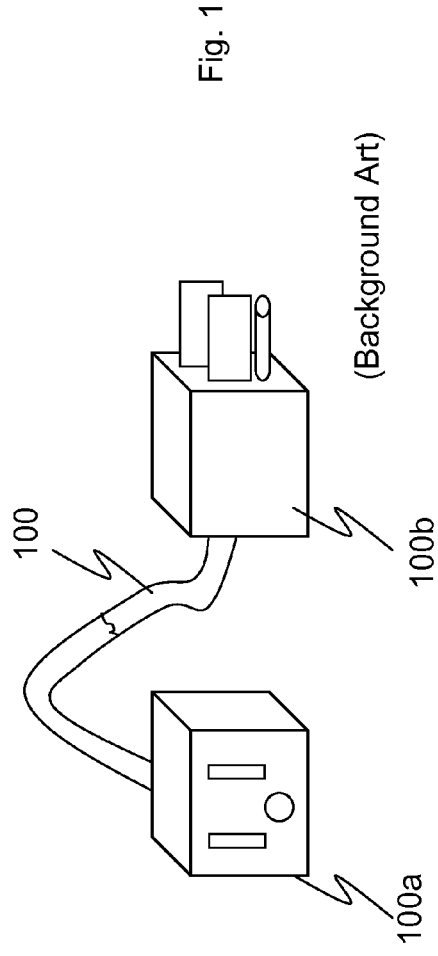
FIG. 1 is a simplified view of a conventional, detachable electrical power cord for attaching between an electrical outlet (e.g., as connected to or part of a Power Distribution Unit) and a piece of electrical equipment.
Figure 2:
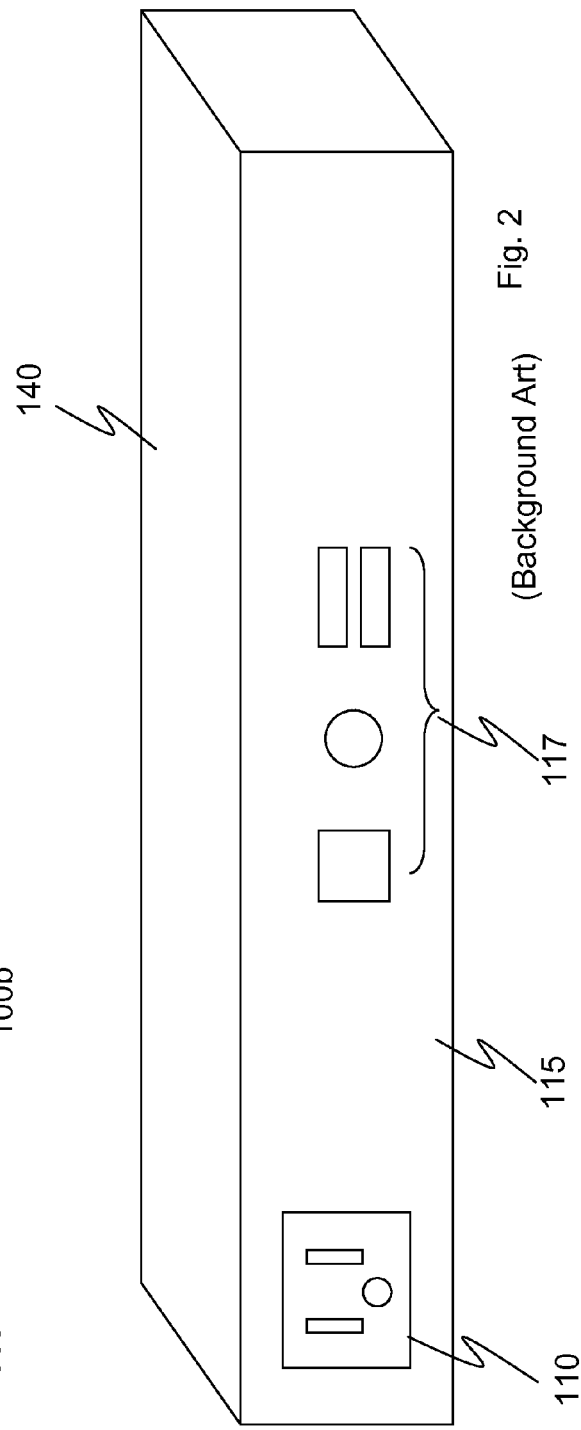
FIG. 2 is a block diagram of a conceptual piece of electrical equipment with various peripheral connections as well as a connection for the power cord of FIG. 1.

As shown in FIG. 1, many pieces of electronic equipment are configured to use a detachable power cord 100 with a female end 100a (that plugs into a socket in the electronic equipment) and a male end 100b (that plugs into an electrical outlet). As shown in FIG. 2, a generalized piece of electrical equipment 140 includes on the back face 115 a socket 110 with a male connection for interfacing with the female end 100a of the cord 100. Typically the back face 115 further includes one or more peripheral connections 117 (e.g., connections for communications transmitters, keyboard, video, mouse and audio connections, and serial connections (such as USB connections)).

As shown in the rear view of the electrical equipment 140 in FIG. 3, by utilizing a transmitter 120 that plugs into the socket 110, the piece of electrical equipment may be locatable using a specialized power source that interacts with the transmitter 120. Preferably the transmitter 120 is affixed to the electrical equipment such that a known relationship between the electrical equipment and the transmitter lasts for the lifetime of the transmitter and/or electrical equipment. The transmitter may be affixed using any fastener (e.g., glue, screw or cable ties attached to mounting plates on the equipment). The transmitters may include specialized mounting features in the molded part of the plug that extends outside of the socket. For example, the transmitter may include a ring such that a cable tie may be passed through the ring and attached to a mounting clip or bracket on the equipment.

As shown in the side view of FIG. 4, the transmitter 120 that is affixed to the electrical equipment 140 receives the female end 100a of the power cord 100a. The male end 100b is plugged into a specialized power supply (described in greater detail below).

Often similar pieces of electrical equipment are grouped together in a common housing. For example, many computer servers and/or keyboard/video/mouse (KVM) switches can be grouped together in a rack as shown in the rear view of FIG. 5. In an exemplary embodiment shown in FIG. 5, a first piece of electrical equipment 140a is coupled to a transmitter 120a which is in turn coupled to the female end 100a-1 of a first power cord. The corresponding male end is then connected to a corresponding outlet 150a of a power distribution unit 180. Similarly, a second piece of electrical equipment 140b is coupled to a transmitter 120b which is in turn coupled to the female end 100a-2 of a second power cord. The corresponding male end is then connected to a corresponding outlet 150b of the power distribution unit 180.

In the embodiment of FIG. 5, the power distribution unit (PDU) 180 is also coupled to two wireless receivers 160a and 160b. In one embodiment, the wireless receivers 160a and 160b are connected to a controller (e.g., a microprocessor or an FPGA) for the power distribution unit 180 using wired communications adapters (e.g., serial communications adapters such as a USB-based communications adapters). In an alternate embodiment, the wireless receivers 160a and 160b may instead (or in addition) contain wireless communications adapters (e.g., 802.11a/b/g/n) for transmitting information back to the controller for the power distribution unit 180.

Figure 6:
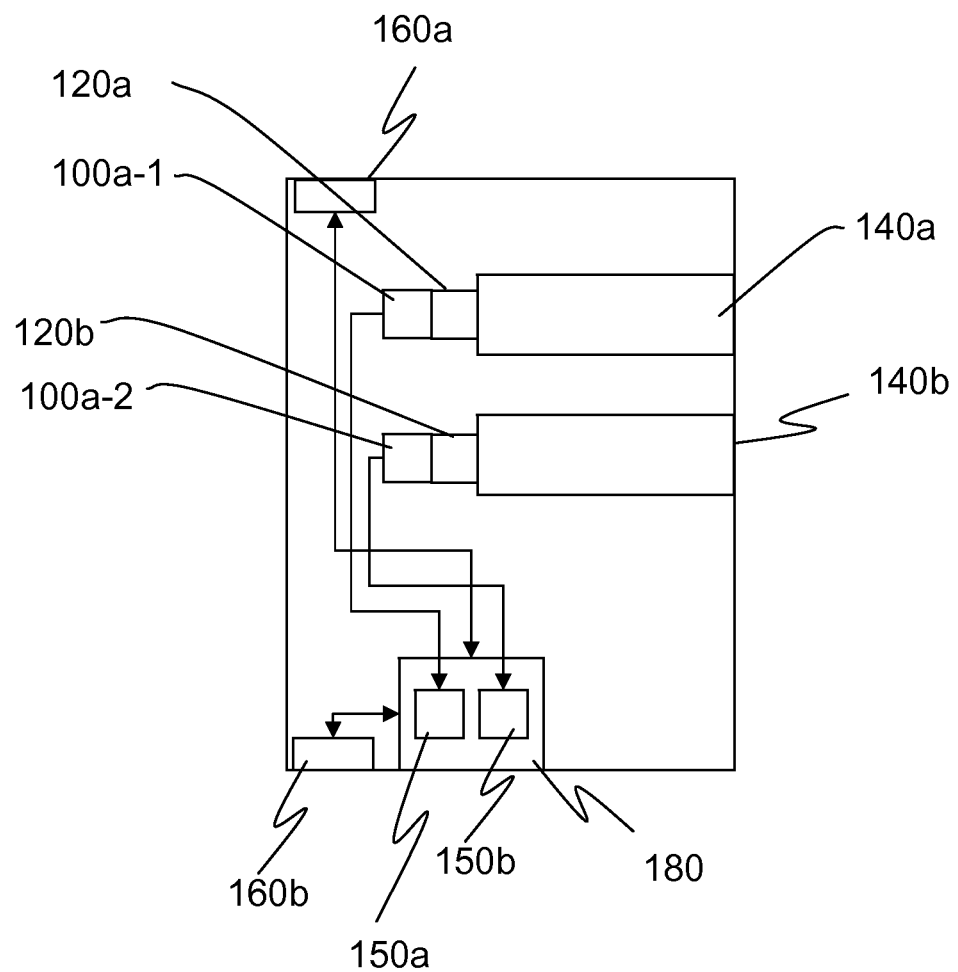
FIG. 6 is a side view of a rack of electrical equipment (such as in FIG. 5) including a Power Distribution Unit and wireless receivers for receiving a response signal received from the transmitter of FIG. 3 after receipt of a trigger signal across an electrical cord such as in FIG. 1.
Figure 7:
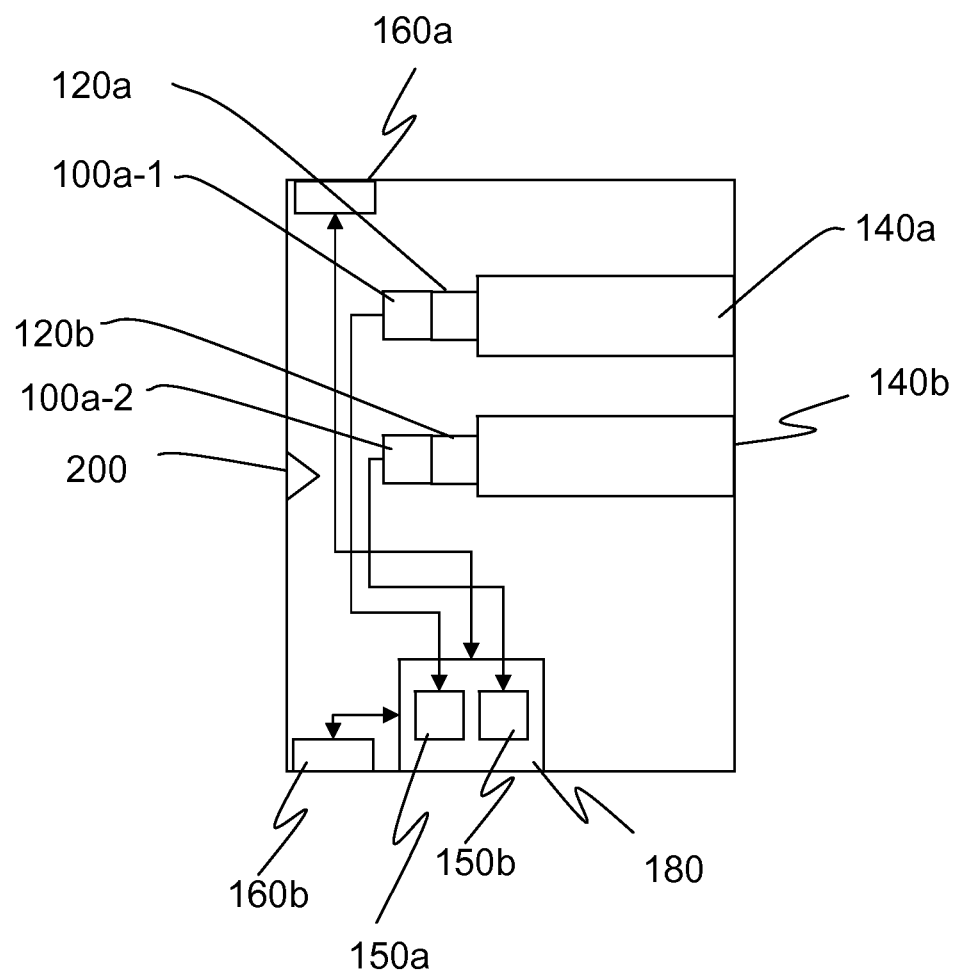
FIG. 7 is a side view of a rack of electrical equipment (such as in FIG. 5) including a Power Distribution Unit, a wireless extender and wireless receivers for receiving a response signal received from the transmitter of FIG. 3 after receipt of a trigger signal across an electrical cord such as in FIG. 1.

FIG. 6 is a side view of the system of FIG. 5 and shows that transmitters 120a and 120b are placed into corresponding sockets of the electrical equipment 140a and 140b. Signals transmitted from the transmitters are received by wireless receivers 160a and 160b located at known positions within the system (e.g., at the top and bottom of a rack). In the embodiment of FIG. 7, the system is supplemented with a wireless reflector 200 in order to direct the wireless signal from a piece of electrical equipment to the receivers 160a and 160b when electrical equipment may otherwise be blocking the signal from reaching the receivers.

Periodically an encoder in the PDU 180 successively sends a high frequency, digitally encoded, electrical signal on each electrical cable 100 that is plugged into it. This encoded signal is designed not disturb the normal 50 or 60 Hz AC frequency of the electrical power. Upon receipt of the high frequency signal the corresponding transmitter 120 plugged into the electrical equipment 140 responds back across the cable 100 with its unique ID. Thus, the PDU 180 would be informed of the unique ID of the electrical equipment attached to the specific power connector.

Later, the encoder in the PDU 180 would then send on the cable 100 another high frequency digitally encoded signal (i.e., a trigger signal) including the unique ID of the corresponding transmitter 120 commanding the transmitter 120 to send out a "presence signal" (e.g., in the form of an ultrasonic signal). The transmitter 120 would then send the presence signal (e.g., an ultrasonic signal sent out horizontally towards the back of the rack and/or up and down towards the top and bottom of the rack). (In an embodiment such as in FIG. 7, the ultrasonic reflector on the back of the rack reflects the ultrasonic waves to the top and bottom of the rack simultaneously avoiding interference from other equipment in the rack.) The ultrasonic receivers 160a and 160b at the top and bottom of the rack would then receive the ultrasonic response signal and notify the PDU 180 through their connections (wired or wireless) to the PDU 180. The PDU 180 then would determine the time difference in the notifications received from each of the ultrasonic receivers 160a and 160b. Based upon the time difference the PDU 180 would calculate where in the rack the electrical equipment is located. For example, if notification from each receiver was received at the same time, then the PDU would determine that the electrical equipment was located at the middle height of the rack of equipment. If the notification from one ultrasonic receiver was received in one half the time it took to receive notification from the other receiver, then that would indicate that the electrical equipment was located at ⅓ of the rack distance from the first receiver, and ⅔ of the rack distance from the second receiver. These distances could then be assigned "U" numbers which are common for designating each rack slot. When the PDU was installed in the rack its unique ID was entered in the database and associated with the specific rack of electrical equipment. After determining the unique ID and location of each piece of electrical equipment in the rack, the PDU would then connect to the database and indicate that the electrical equipment with the known ID is contained within the rack at the location that has been determined. This would allow every piece of equipment that goes in a rack and draws electrical power to be associated with the rack and to have its location within the rack to be determined.

It should be noted that the two functions: which rack the equipment is located in, and where in the rack it is located are separable. The "which rack" function can be performed without the "where in the rack" functionality. Similarly, the "where in the rack" functionality could be performed without the "which rack" function.

Figure 8:
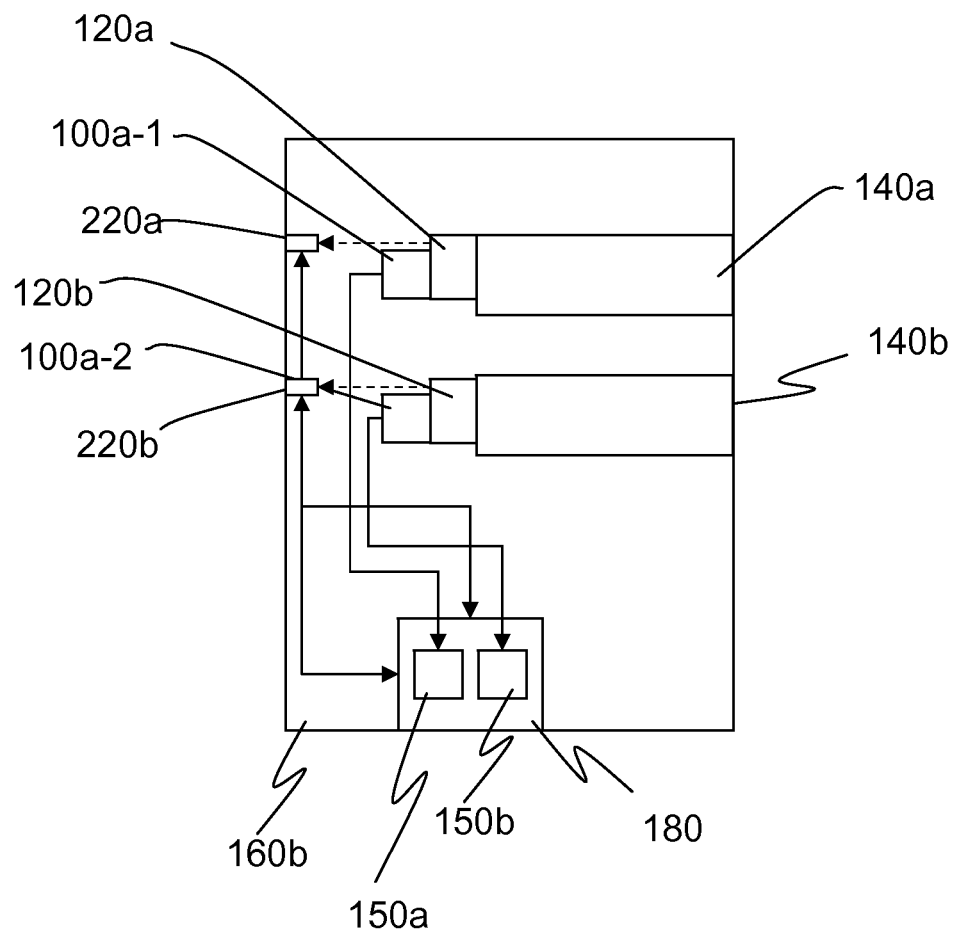
FIG. 8 is a side view of a rack of electrical equipment (such as in FIG. 5) including a Power Distribution Unit and individual wireless receivers for receiving a response signal received from the transmitter of FIG. 3 after receipt of a trigger signal across an electrical cord such as in FIG. 1.

As shown in FIG. 8, in yet another embodiment, wireless receivers (e.g., IR receivers) 220a and 220b may be placed in locations (e.g., behind the transmitters 120a and 120b) such that the IR receivers receive an infra-red signal transmitted from a part of the corresponding transmitter 120a or 120b when commanded by the PDU 180 using a trigger signal. (In such a configuration, the transmitter 120 may be made larger than the female end 100a such that the IR signal is not blocked by the power cord.) IR receivers in such a configuration may be designed to use shielding to reduce or eliminate the signal received from transmitters not associated with the transmitter. For example, receiver 220a is designed to receive a signal from transmitter 120a but to block signals from transmitter 120b, etc. The IR receivers 220 are connected (via wire or wireless communication) to the PDU 180. Since the receivers 220 are assigned to individual transmitters, there is no need for the PDU 180 to calculate differential arrival times between multiple receivers.

In an embodiment using ultrasonic transmitters and receivers, the transmitter 120 may be plugged into an adapter rather than directly into the electrical equipment. In such a configuration, the adapter may move the transmitter left or right to allow the ultrasonic signals to not be blocked by other transmitters above or below it.

While certain configurations of structures have been illustrated for the purposes of presenting the basic structures of the present invention, one of ordinary skill in the art will appreciate that other variations are possible which would still fall within the scope of the appended claims.

The invention claimed is:

1. A power distribution unit control system, comprising:
a wireless transmitter configured to plug into an electrical cord outlet of a piece of electrical equipment and configured to receive an electrical cord of the piece of equipment;
an encoder configured to transmit a trigger signal to the wireless transmitter over the electrical cord of the piece of equipment, wherein the wireless transmitter sends out a presence signal in response to receiving the trigger signal;
at least one receiver for receiving the presence signal from the wireless transmitter, each receiver of the at least one receiver including a communications adapter; and
a controller for receiving from the at least one communications adapter information corresponding to when the presence signal was received at the at least one receiver.

2. The power distribution control unit as claimed in claim 1, wherein at least one communications adapter comprises a wired communications adapter.

3. The power distribution control unit as claimed in claim 2, wherein the wired communications adapter comprises a serial communications adapter.

4. The power distribution control unit as claimed in claim 3, wherein the serial communications adapter comprises a USB-based communications adapter.

5. The power distribution control unit as claimed in claim 1, wherein the controller comprises a microprocessor.

6. The power distribution control unit as claimed in claim 1, wherein the encoder is configured to encode a unique ID as part of the trigger signal, and
wherein the wireless transmitter sends out the presence signal in response to receiving the trigger signal with the unique ID corresponding to the wireless transmitter.

7. The power distribution control unit as claimed in claim 6, wherein at least one communications adapter comprises a wired communications adapter.

8. The power distribution control unit as claimed in claim 7, wherein the wired communications adapter comprises a serial communications adapter.

9. The power distribution control unit as claimed in claim 8, wherein the serial communications adapter comprises a USB-based communications adapter.

10. The power distribution control unit as claimed in claim 6, wherein the controller comprises a microprocessor.

11. The power distribution control unit as claimed in claim 6, wherein the wireless transmitter comprises an ultrasonic transmitter, and wherein the at least one receiver comprises at least two ultrasonic receivers.

12. The power distribution control unit as claimed in claim 11, wherein the controller calculates a time difference in when the presence signal was received at the at least two ultrasonic receivers.

13. The power distribution control unit as claimed in claim 12, wherein at least one communications adapter comprises a wired communications adapter.

14. The power distribution control unit as claimed in claim 12, wherein at least one communications adapter comprises a wireless communications adapter.

15. The power distribution control unit as claimed in claim 6, wherein the wireless transmitter comprises an infrared transmitter, and wherein the at least one receiver comprises at least one infrared receiver.

16. The power distribution control unit as claimed in claim 6, wherein at least one communications adapter comprises a wireless communications adapter.

17. The power distribution control unit as claimed in claim 1, wherein the wireless transmitter comprises an ultrasonic transmitter, and wherein the at least one receiver comprises at least two ultrasonic receivers.

18. The power distribution control unit as claimed in claim 17, wherein the controller calculates a time difference in when the presence signal was received at the at least two ultrasonic receivers.

19. The power distribution control unit as claimed in claim 1, wherein the wireless transmitter comprises an infrared transmitter, and wherein the at least one receiver comprises at least one infrared receiver.

20. The power distribution control unit as claimed in claim 1, wherein at least one communications adapter comprises a wireless communications adapter.

* * * * *

UNITED STATES PATENT AND TRADEMARK OFFICE
CERTIFICATE OF CORRECTION

PATENT NO. : 8,427,301 B2  
APPLICATION NO. : 12/822723  
DATED : April 23, 2013  
INVENTOR(S) : Craig S. Siegman Page 1 of 2

It is certified that error appears in the above-identified patent and that said Letters Patent is hereby corrected as shown below:

In the claims

Column 4, line 57, cancel the text beginning with "7. The power distribution unit control unit" and ending with "wireless communications adapter" in column 5, line 16, and insert the following claims:

--7. The power distribution control unit as claimed in claim 1, wherein the wireless transmitter comprises an ultrasonic transmitter, and wherein the at least one receiver comprises at least two ultrasonic receivers.
8. The power distribution control unit as claimed in claim 1, wherein the wireless transmitter comprises an infrared transmitter, and wherein the at least one receiver comprises at least one infrared receiver.
9. The power distribution control unit as claimed in claim 1, wherein at least one communications adapter comprises a wireless communications adapter.
10. The power distribution control unit as claimed in claim 6, wherein at least one communications adapter comprises a wired communications adapter.
11. The power distribution control unit as claimed in claim 10, wherein the wired communications adapter comprises a serial communications adapter.
12. The power distribution control unit as claimed in claim 11, wherein the serial communications adapter comprises a USB-based communications adapter.
13. The power distribution control unit as claimed in claim 6, wherein the controller comprises a microprocessor.
14. The power distribution control unit as claimed in claim 6, wherein the wireless transmitter comprises an ultrasonic transmitter, and wherein the at least one receiver comprises at least two ultrasonic receivers.--.

Column 8, line 4, cancel the text beginning with "17. The power distribution control unit" and ending with "ultrasonic receivers." in column 6, line 8, and insert the following claim:

--17. The power distribution control unit, as claimed in claim 7, wherein the controller calculates a time difference in when the presence signal was received at the at least two ultrasonic receivers.--.

Signed and Sealed this  
Fifth Day of April, 2016

Michelle K. Lee  
*Director of the United States Patent and Trademark Office*

CERTIFICATE OF CORRECTION (continued)
U.S. Pat. No. 8,427,301 B2

In the claims

Column 6, line 10, delete "17" and insert --14--.

Column 6, line 13, cancel the text beginning with "19. The power distribution control unit" and ending with "infrared receiver." in column 6, line 17, and insert the following claim:

--19. The power distribution control unit as claimed in claim 18, wherein at least one communications adapter comprises a wired communications adapter.--.

Column 6, line 18, delete "1" and insert --18--.